United States Patent [19]
Hobbs

[11] Patent Number: 6,088,505
[45] Date of Patent: Jul. 11, 2000

[54] HOLOGRAPHIC PATTERNING METHOD AND TOOL FOR PRODUCTION ENVIRONMENTS

[75] Inventor: Douglas S. Hobbs, Lexington, Mass.

[73] Assignee: Holographic Lithography Systems, Inc., Bedford, Mass.

[21] Appl. No.: 09/202,367

[22] PCT Filed: Jun. 10, 1997

[86] PCT No.: PCT/US97/11625

§ 371 Date: Feb. 16, 1999

§ 102(e) Date: Feb. 16, 1999

[87] PCT Pub. No.: WO97/47997

PCT Pub. Date: Dec. 18, 1997

Related U.S. Application Data

[60] Provisional application No. 60/019,491, Jun. 10, 1996.

[51] Int. Cl.⁷ ...................................................... G02B 6/00
[52] U.S. Cl. .................................. 385/147; 12/24; 12/31
[58] Field of Search .............................. 385/1, 4, 12, 14, 385/15, 24, 28, 31, 32, 33, 115, 116, 147; 219/121.6, 121.61, 127.75, 121.76; 359/619, 626; 250/227.23

[56] References Cited

U.S. PATENT DOCUMENTS

| | | |
|---|---|---|
| 3,591,252 | 7/1971 | Lu . |
| 4,037,969 | 7/1977 | Feldman et al. . |
| 4,104,070 | 8/1978 | Moritz et al. . |
| 4,402,571 | 9/1983 | Cowan et al. . |
| 4,440,850 | 4/1984 | Paul et al. . |
| 4,496,216 | 1/1985 | Cowan . |
| 4,789,214 | 12/1988 | Vilhelmsson et al. . |
| 4,839,250 | 6/1989 | Cowan . |
| 4,874,213 | 10/1989 | Cowan . |
| 4,888,260 | 12/1989 | Cowan . |
| 5,003,567 | 3/1991 | Hawryluk et al. . |
| 5,055,383 | 10/1991 | Koblinger et al. . |
| 5,142,385 | 8/1992 | Anderson et al. . |
| 5,176,970 | 1/1993 | Hawryluk et al. . |
| 5,178,974 | 1/1993 | Hawryluk et al. . |
| 5,216,257 | 6/1993 | Brueck et al. . |
| 5,334,342 | 8/1994 | Harker et al. . |
| 5,343,292 | 8/1994 | Brueck et al. . |
| 5,384,464 | 1/1995 | DeFornel et al. . |
| 5,415,835 | 5/1995 | Brueck et al. . |
| 5,430,816 | 7/1995 | Furuya et al. ............................ 385/33 |

OTHER PUBLICATIONS

C.O. Bozler, C.T. Harris, S. Rabe, D.D. Rathman, M.A. Hollis, and H.I. Smith, "Arrays of gated field–emitter cones having 0.32 um tip–to–tip spacing", J. Vac. Sci. Technol. B 12(2), Mar./Apr. 1994, pp. 629–632.

C.A. Spindt, "Field Emitter Arrays for Vacuum Microelectronics", IEEE Transactions On Electron Devices, vol. 38, No. 10, Oct. 1991, pp. 2355–2363.

Z. Huang, N.E. McGruer, and K. Warner, "200 nm Gated Field Emitters", IEEE Electron Device Letters, vol. 14, No. 3, Mar. 1993.

J.W. Goodman, Introduction to Fourier Optics, McGraw–Hill, San Fran., 1968 No Month.

C.G. Bernhard, "Structural and functional adaptation in a visual system.", Endeavor, 26, pp. 79–84, 1967.

P.B. Clapham and M.C. Hutley, "Reduction of lens reflexion by the 'Moth Eye' principle", Nature, 244, pp. 281–282, Aug. 3, 1973.

(List continued on next page.)

*Primary Examiner*—Phan T. H. Palmer

[57] ABSTRACT

A high resolution, high-throughout, large field size, production environment, lithographic tool system and method includes an interferometric pattern generator utilizing three or four mutually coherent optical beams organized in a flexible beam expansion, filtering, aperturing, and delivery system, large area pattern uniformity is attained via optimized illumination beam positioning and shaping. A passive stabilization system achieves fully modulated interferometric patterns in high mechanical and acoustical vibration manufacturing environments.

22 Claims, 10 Drawing Sheets

OTHER PUBLICATIONS

M.C. Hutley & S.J. Wilson, "The optical properties of 'moth–eye' antireflection surfaces", Optica Acta, vol. 29, No. 7, pp. 993–1009, 1982.

W.H. Southwell, "Pyramid–array surface relief structures producing antireflection index matching on optical surfaces", JOSA A, vol. 8, No. 3, 549–553, Mar. 1991.

J.F. DeNatale et. al., "Fabrication and characterization of diamond moth eye antireflection surfaces on Ge", J. Appl. Phys., 71, (3), pp. 1388–1393, Feb. 1, 1992.

A.B. Harker and J.F. DeNatale, "Diamond gradient index 'moth eye' antireflection surfaces for LWIR windows", SPIE vol. 1760, Window and Dome Technologies and Materials III, pp. 261–267, Jul. 1992.

Murakami, T., Togari, H., & Steinman, A., "Electrostatic problems and ionization solutions in TFT–LCD production", Solid State Technology, Jan. 1997, pp. 99–102.

Hatoh, H., et al., "Dependence of pretilt angle on the topography of substrate in liquid crystal alignment brought about by rubbing technique", Appl. Phys. Lett., 64, (9), pp. 1103–1104, Feb. 28, 1994.

Coherent laser company specifications, Innova argon–ion laser lifetime data, 1997.

J.J. Cowan, "Holographic honeycomb microlens", Optical Engineering, vol. 24, No. 5, Sep./Oct. 1985, pp. 796–802.

Dammann, H., and Klotz, E., Optica Acta, 1977, vol. 24 pp. 505–515 Coherent Optical Generation and Inspection of Two–Dimensional Periodic Structures.

Leith, E.N., Hershey, R.R., and Chen, H.S., "Techniques for high quality fringe generation", SPIE vol. 1211, Computer and Optically Formed Holographic Optics (1990) pp. 158–165.

K. Derbyshire, "Beyond AMLCDs: Field Emission Displays?", Solid State Technology, Nov. 1994, pp. 55–63.

G.P. Bryan–Brown, et. al., "Grating Aligned Bistable Nematic Device", SID 97 Symposium Digest vol. XXVIIII, May 11–16, 1997, pp. 37–40.

J.P. Ryan and M. Steinberg, WDM and Optical Networks: Market Directions, Optics and Photonics News, OSA, Feb. 1998, p. 25.

M.L. Schattenburg, H.I. Smith, et. al., "Fabrication of high energy x–ray transmission gratings for AXAF", SPIE Proceedings 2280, San Diego, CA, Jul. 24–29, 1994.

J. Ferrera, M.L., Schattenberg, H.I. Smith, "Analysis of distortion in interferometric lithography", J. Vac. Sci. Technol. B, 14(6), p. 4009, Nov./Dec. 1996.

H. Hock, C. King, and J. Helbert, "Resist Image Reversal for Next–generation VLSI Circuit Fabrication", Semiconductor International, Sep. 1987, pp. 164–168.

M. Long & J. Newman, "Image Reversal Techniques with Standard Positive Photoresist", SPIE Proceedings, vol. 469, Advances in Resist Technology, 1984, p. 189.

C. Hartglass, "Optimization of Image Reversal of Positive Photoresist", Proceedings of Kodk Interface, 1985.

Shank et al., "Optical Technique for producing 0.1 $\mu$m periodic structures", Applied Physics Letters, vol. 23, No. 3, Aug. 1973.

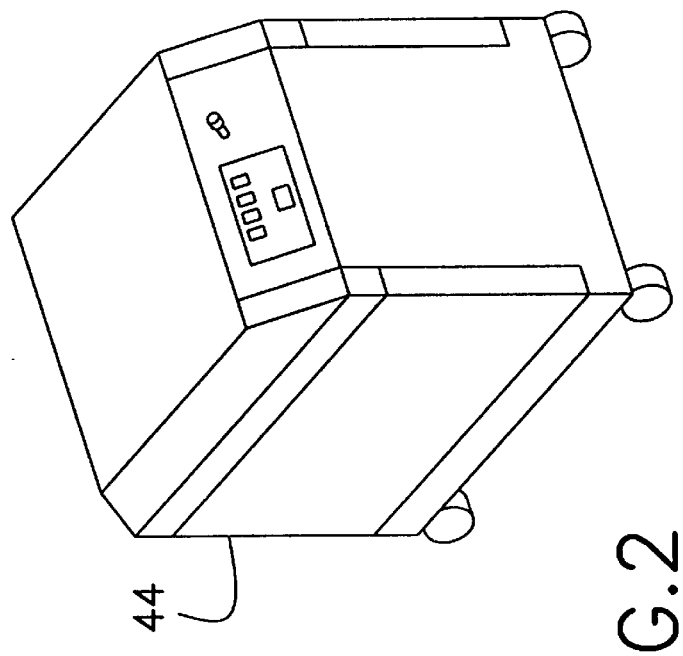
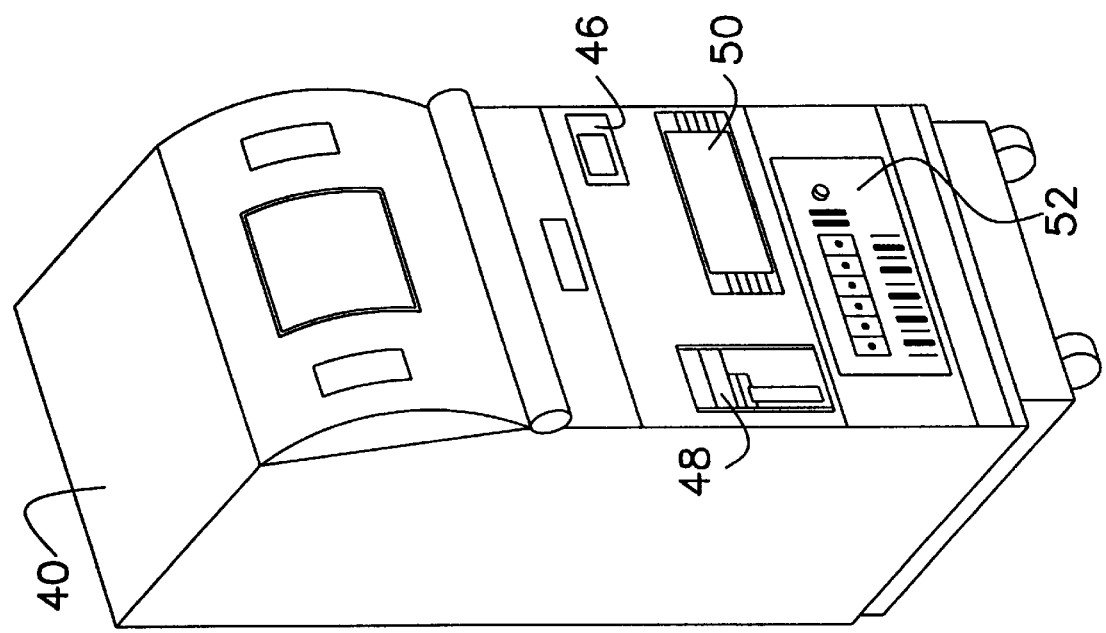
FIG. 2

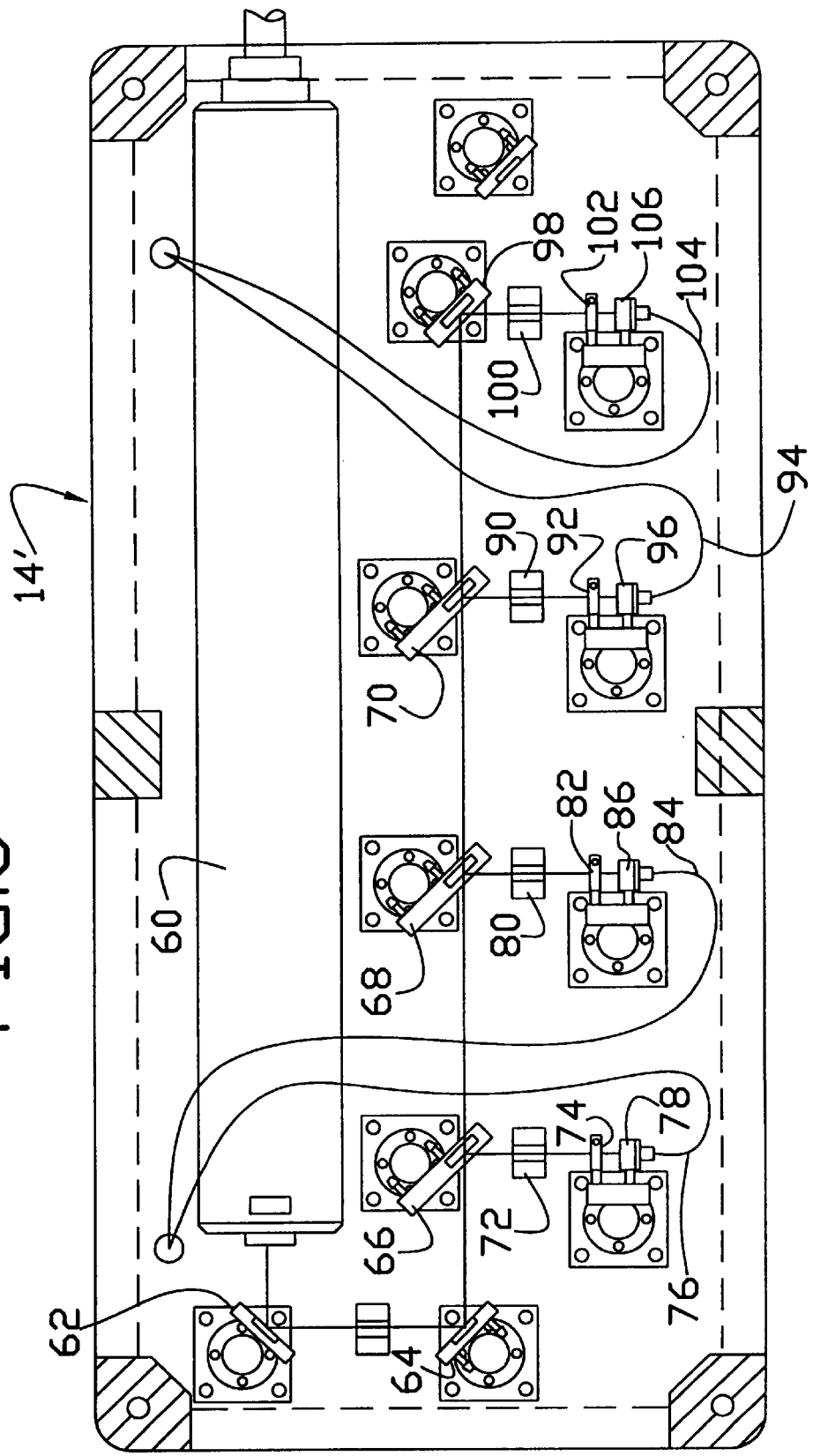

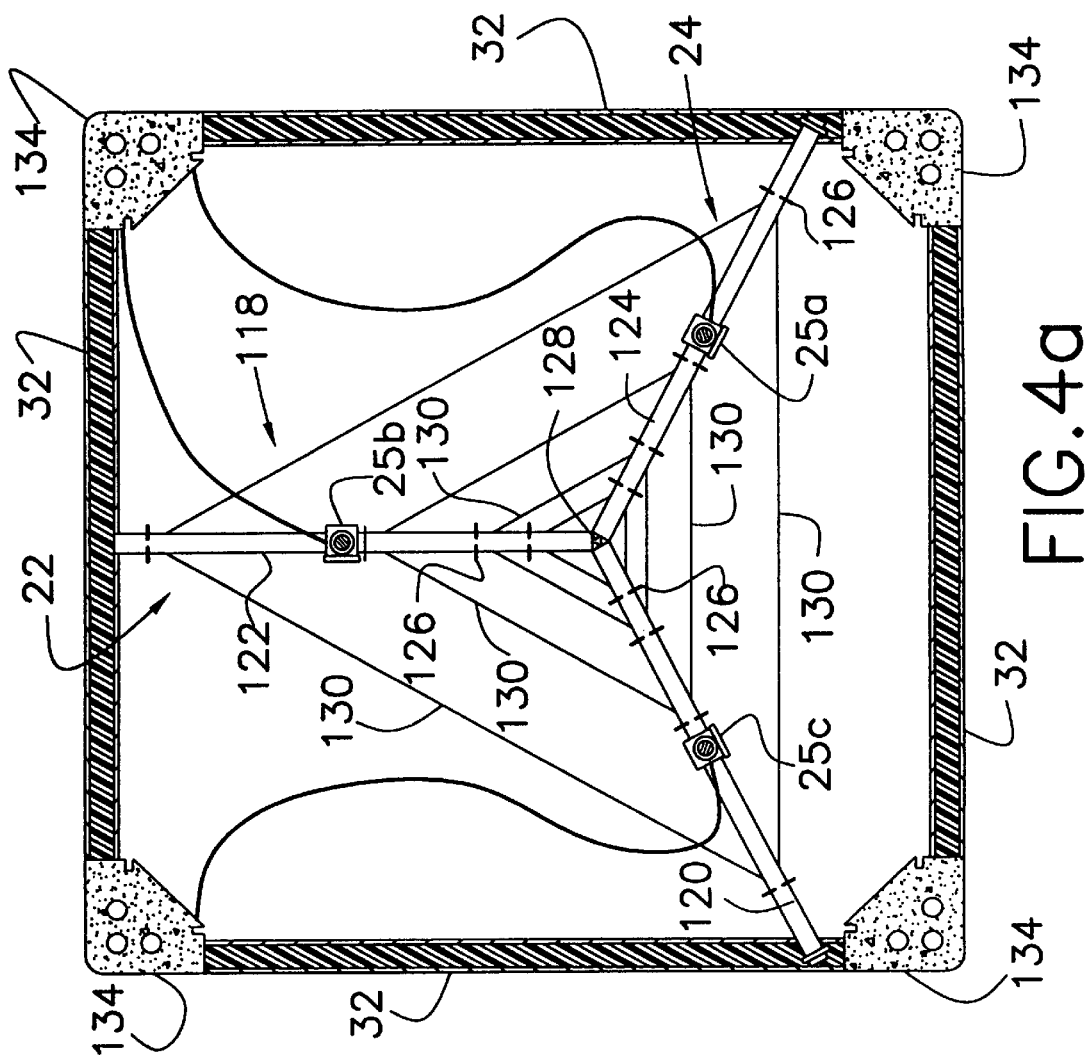

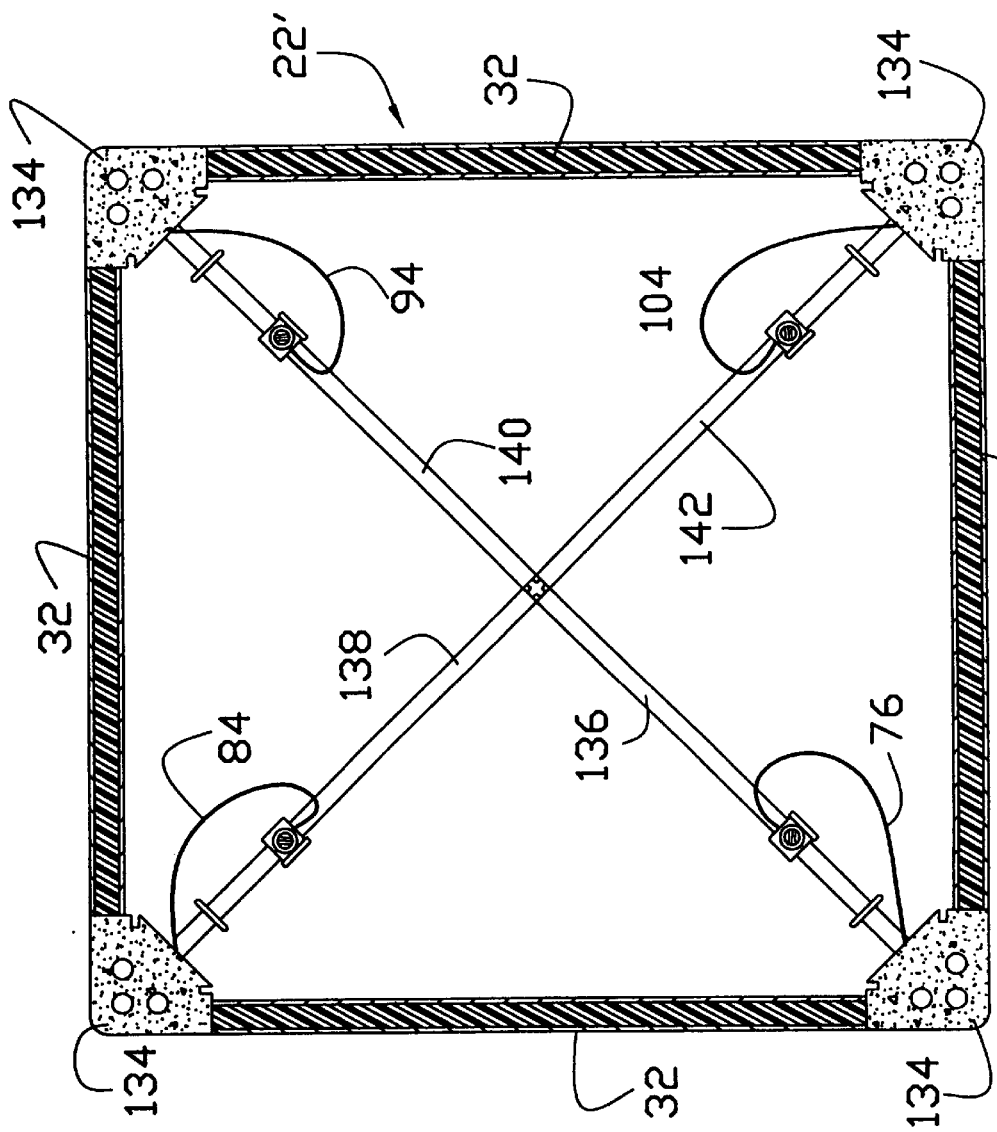

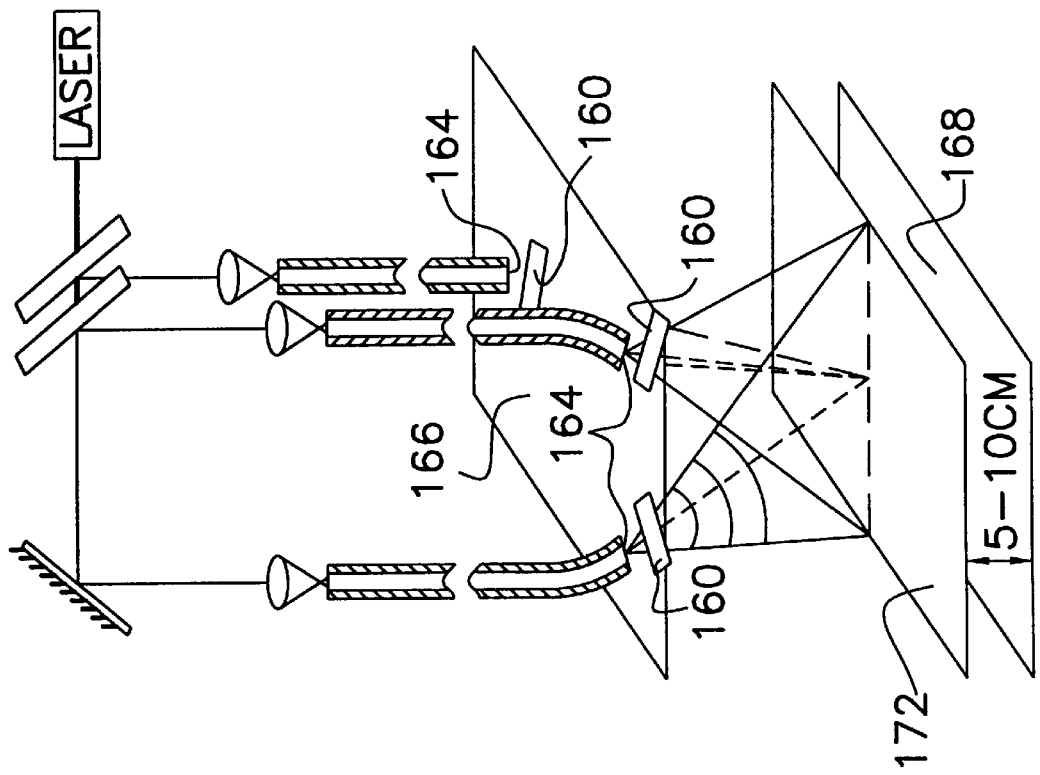
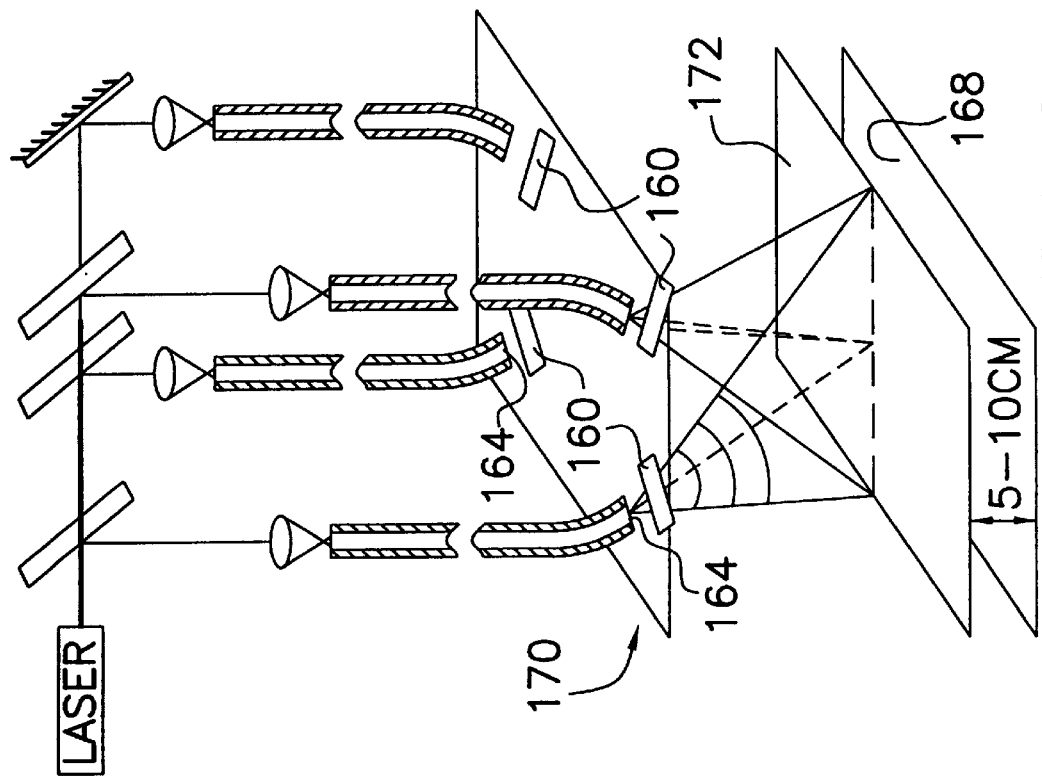

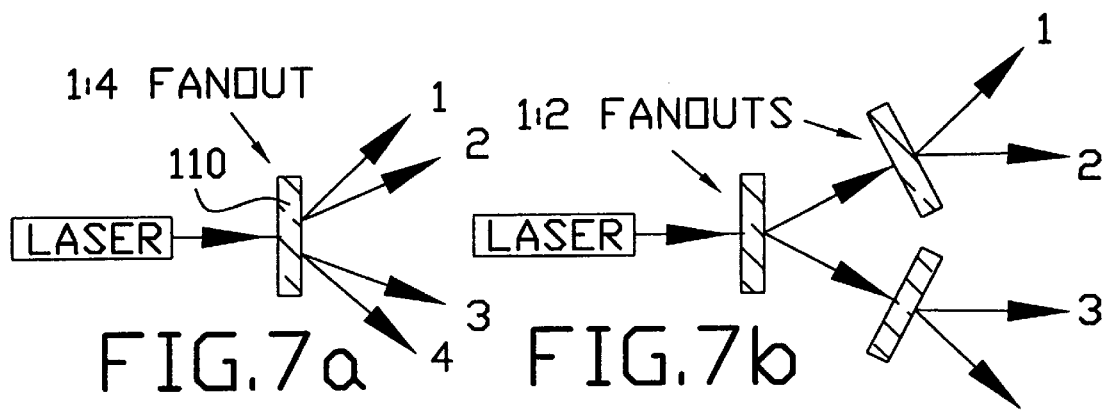
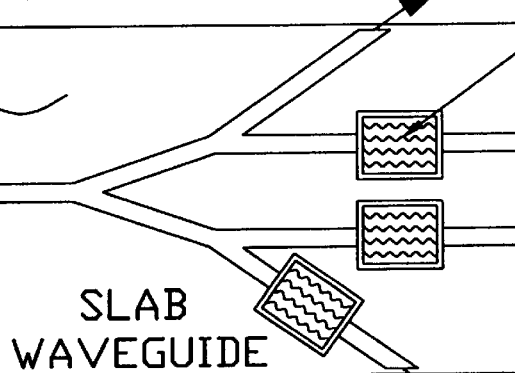

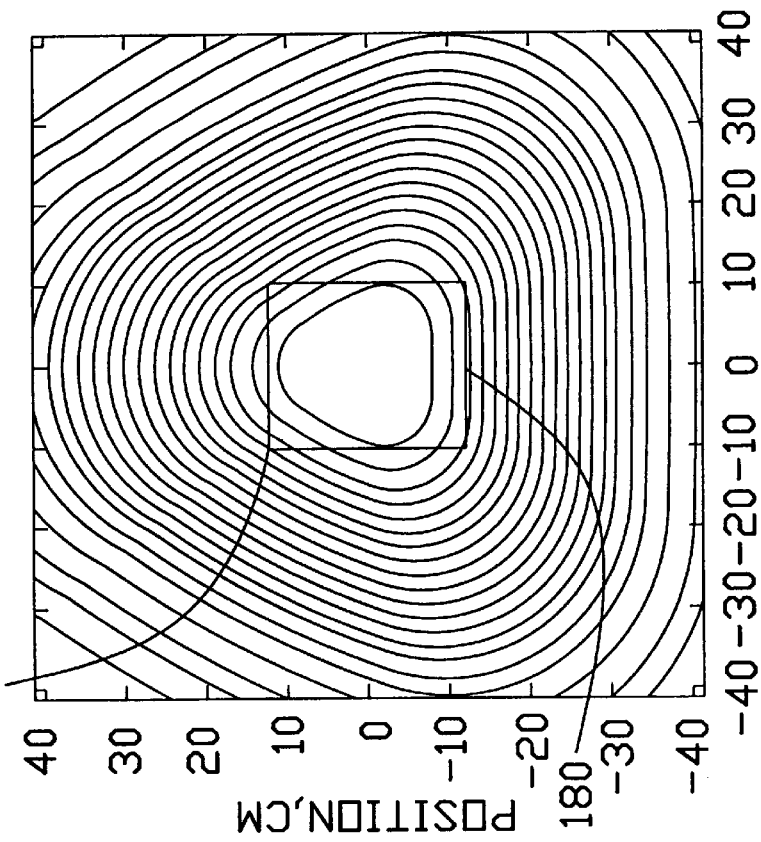
FIG.8b CONTOUR PLOT: SHIFTED THREE-BEAM ILLUMINATION
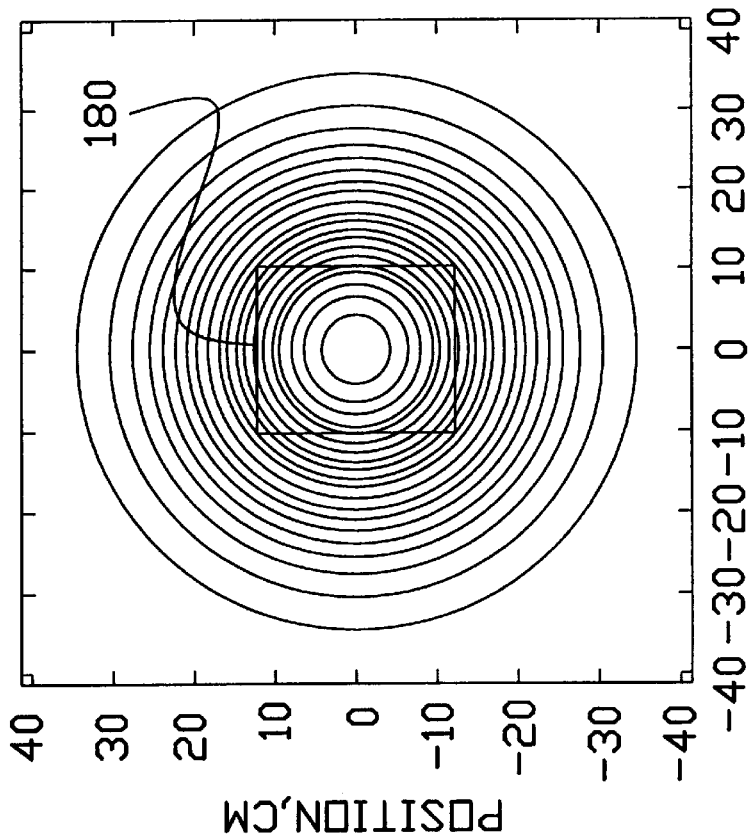
FIG.8a CONTOUR PLOT: STANDARD THREE-BEAM ILLUMINATION

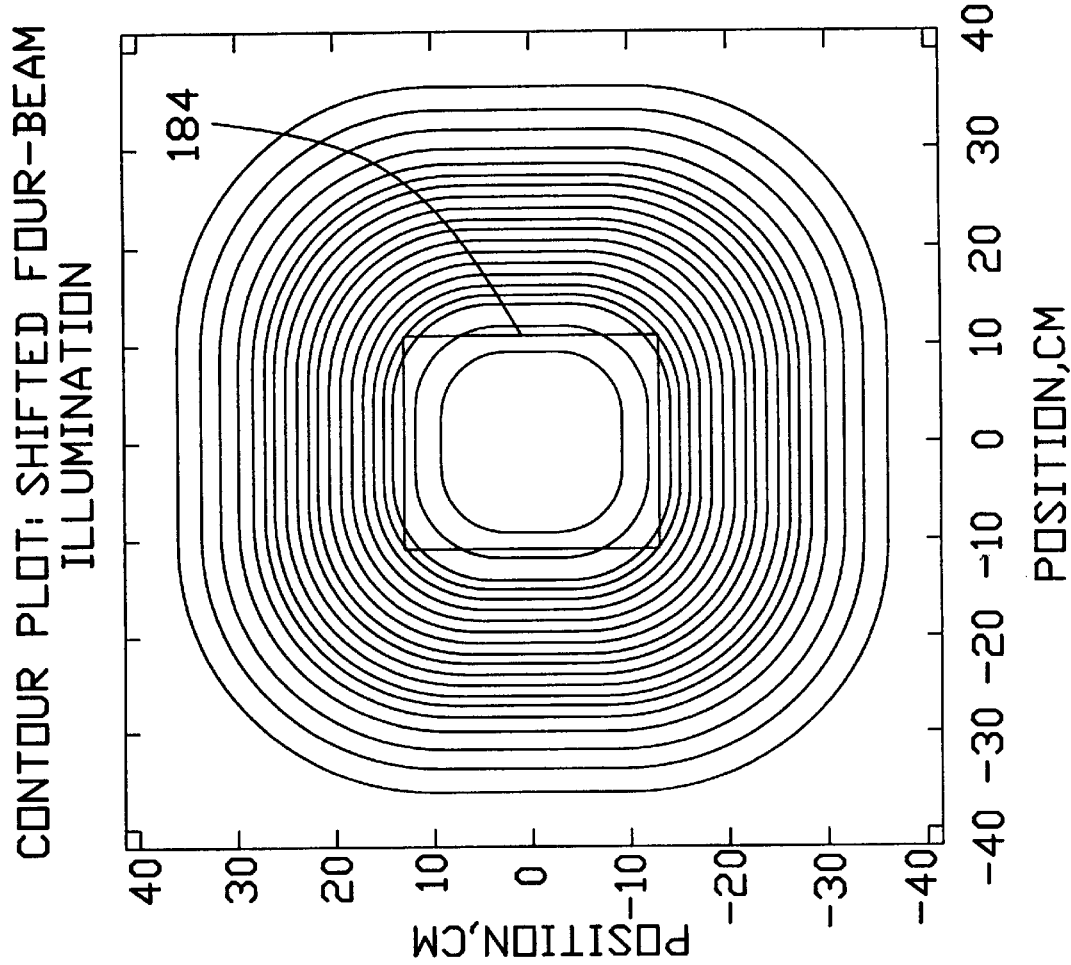

HOLOGRAPHIC PATTERNING METHOD AND TOOL FOR PRODUCTION ENVIRONMENTS

This is a continuation of U.S. provisional application Ser. No. 60/019,491, filed Jun. 10, 1996.

BACKGROUND OF THE INVENTION

1. Field of the Invention

The present invention relates to a method and apparatus for high throughput holographic microlithography in which interferometric patterning techniques suitable for producing periodic arrays of sub-micron sized structures are adapted for and incorporated into a high-throughput, large field size manufacturing tool. The method and tool of the present invention have applications in the display, semiconductor, and optics manufacturing industries.

2. Description of the Prior Art

An unmet need exists for an efficient tool adapted for production of flat panel displays based on distributed cathode field emission display (FED) technology, a strong competitor in the flat panel display market currently dominated by liquid crystal display (LCD) manufacturers. A FED is a distributed cathode, flat panel analog to the well known cathode ray tube (CRT). Essentially, billions of miniature electron 'gun' cathodes are distributed spatially over the surface of a display substrate. Electrons are emitted from the tiny cone-shaped cathodes under the influence of a high accelerating potential, and strike a phosphor screen placed over a common anode and are thereby converted to photons (i.e., light). The most critical step in the fabrication of the FED distributed cathode matrix is patterning of an array of holes or wells in which emitter cones are grown. In the prior art, a photosensitive medium such as photoresist has been employed to record an image of a hole array formed by conventional photo-lithographic techniques such as shadow masking (contact printing), optical projection, electron or laser beam direct writing. The hole array or pattern, in photoresist, can then be used as an etch mask in the process of forming the holes. In the prior art, hole patterns have been limited by resolution and field size of the imaging or writing systems, and complex, often expensive, work-around solutions have been required to achieve modest field sizes of fifty by fifty mm with hole diameters in the one to two micron range. Recent research has demonstrated that reduction in the hole size (and consequently the emitter size), below the one micron range provides numerous benefits such as a reduced gate voltage, lower power consumption, greater current densities per pixel, and built-in redundancy. Thus, to fully realize the potential of FED technology, an inexpensive, high speed, production environment lithographic tool, incorporating a patterning technology capable of producing large-area, high-density, sub-micron diameter hole arrays with few defects and at low cost, is needed.

Holographic or interferometric lithography has been proven in laboratory environments to be feasible for generating the high-resolution periodic structures suitable for flat panel FEDs and exploits the mutual coherence of multiple optical beams derived from a single light source such as a laser. The laser beams are made to overlap in some region of space and interfere to produce patterns of light and dark areas that repeat on a scale proportional to the wavelength and are subsequently recorded in photosensitive media such as photoresist. Conventional contact or projection photo masks are not required and so holographic lithography is known as a "maskless" lithography technique. In addition, by exploiting inherent photoresist and etching process non-linearities, a variety of surface relief structures can be generated with no change in the optical configuration.

Other useful surface relief structures can be patterned using holographic lithography such as a "motheye" or sub-wavelength-structure (SWS) surfaces. Motheye surface structures have been shown to be effective for nearly eliminating the reflectance of light from an optical interface such as between air and a window or a refractive optical element. The term "motheye" is derived from the insect's eye, a natural analog; it was observed that the eye of a nocturnal insect (e.g., a moth) reflected little or no light regardless of the light wavelength or the angle at which incident light struck the eye surface. The eye surface functions in a manner similar to a graded index material, essentially allowing the smooth transition between media with differing bulk density. To avoid diffraction effects, synthetic motheye surfaces must be fabricated with feature sizes and spacings smaller than the wavelength of light incident upon the surface. For most infrared or visible wavelength applications, this necessitates structure spacings in the sub-micron to sub-half micron range, patterned over the entire surface (e.g., window or optic area). A means for manufacturing motheye structures in high volumes and over large areas is not available in the prior art and a variety of products could benefit from the increased ruggedness and anti-reflective performance afforded by motheye surfacing over large areas.

Manufacture of liquid crystal displays (LCDs), also requires improvement. Liquid crystals (LCs) are anisotropic molecules which can affect the properties of light with which they interact, and, under the influence of an electric field, can vary the magnitude of this affect. LCDs are formed by the creation of a cell, typically constructed using glass, within which the LC molecules are confined. The term "crystal" refers to the structure or ordering of the LC molecules into a definable or measurable state typically found with molecules in a solid state. This artificially created ordering is accomplished by depositing thin layers of material on the boundaries of the cell, which either physically, or electro-statically force the LC molecules to preferentially align in one direction. The "alignment layers" as they are known in the art, are typically processed using a physical rubbing or buffing technique comprising a spinning drum or cylinder and rolling it over the cell substrate coated with alignment material. High levels of hazardous static charge and spreading particulate (from the rubbing material) are generated during this process; in addition, manufacturing yields can be improved.

SUMMARY OF THE INVENTION

LCD manufacturing yield increases are provided by incorporating a non-mechanical, non-contact alignment layer process which avoids problems with static charge and is compatible with existing manufacturing equipment and environments. The process of the present invention includes patterning surface structures into an alignment material layer. Using the holographic lithography techniques of the present invention, surface structure LC alignment layers are produced with the enhanced anti-reflective properties of motheye surfaces. By producing sufficient asymmetry in the surface structures, the patterning process allows control of both angular rotation and angular tilt (known as pre-tilt or tilt-bias in the art) of the LC molecules with respect to the cell walls.

It is, therefore, an object of this invention to provide a holographic lithography patterning tool enabling the high-volume processing of LC structures.

It is also an object of this invention to provide a holographic lithography patterning tool enabling the high-volume manufacturing of large-screen area flat panel displays based on FED technology.

It is another object of this invention to provide a manufacturing tool capable of producing motheye antireflection surface relief patterns for visible and infrared window and optics applications, and for the diamond film industry. As noted above, the LCD industry can also benefit from this invention which allows the production of structured alignment layers with enhanced optical performance and greater product yield. Very large scale integration (VLSI) semiconductor and electro-optic device manufacturing can also use the method and tool of the present invention in sub-half micron processes and optical beam modulation devices.

These and other objects of the invention are attained by providing a manufacturing tool having four major components: first, a source of polarized, coherent optical radiation with a wavelength suitable for exposing photosensitive media such as that derived from a laser; second, a flexible, re-configurable beam delivery system with a means to divide and re-direct, or fanout the coherent radiation into a two, three or four beam interferometric configuration; third, a structure for damping the acoustical and mechanical vibrations typical of manufacturing environments; and fourth, a mechanized two-dimensional translation stage, panel or wafer mount with a computer controller for replicating the patterning area over arbitrarily large substrates.

Holographical lithography demonstrations in the laboratory have employed UV wavelength light derived from an argon ion gas laser which is highly automated and reliable, making it a good choice for a manufacturing tool. A wavelength in the deep blue spectral range is also available with argon ion gas lasers; the wavelength choice becomes a tradeoff between photoresist sensitivity and laser power. A large variety of photoresists possess high sensitivity to energy in the near UV spectral range, whereas the number of photoresists sensitive to energy having a visible blue wavelength is more limited, and in those photoresists, sensitivity is typically lower. However, the blue wavelength is currently the more practical choice for a manufacturing tool, for a number of reasons: first, the divergence of an optical beam for a given waist or aperture size decreases for shorter wavelengths (a relationship having a direct impact on field size in the proposed system—field size is 30% larger for 458 nm light than for 351 nm—again given a fixed aperture size); second, alignment and maintenance of a holographic setup is greatly simplified when operating with a visible, relatively eye-safe light source; and third, laser lifetime for the argon-ion gas laser is dramatically reduced when operated at near UV wavelengths. A production environment laser, consequently, is expected to last up to two times longer when operated at 458 nm. Finally, a flexible beam delivery system is an integral component of the present invention and requires specialized optical fibers which, to date, exhibit inferior, unstable, and impractical performance when guiding UV wavelength light.

Laboratory demonstrations have produced two-dimensional patterns utilizing two-beam holographic technology but requiring cumbersome mechanical rotation between two superimposed recordings, and so are not practical in a production tool system. Consequently, a further object of this invention is to provide a patterning system based on three or four beam interference, requiring only a single exposure to generate two-dimensional arrays of holes, cones, posts, tips, vias, mesas, grids, or micro lenses. Multi-beam intensity patterns also inherently possess a greater contrast between light and dark areas, yielding structures having higher aspect ratios.

Another significant object of this invention is to replace the conventional, mechanically unstable spatial filters of the prior art with single mode, polarization maintaining optical fibers, thereby eliminating optical noise and providing highly divergent, large area beams and providing a flexible means for controlling and modifying the optical configuration. In addition, the flexibility afforded by optical fibers allows equalization of beam path lengths and elimination of the longitudinal mode suppressing etalon incorporated in the gas laser source. This improvement results in a gain in laser power (by nearly a factor of two) and consequently a doubling of throughput.

Equalization of optical beam path lengths is also facilitated by employing a non-conventional means for dividing the multiple beams into equal parts. A single diffracting element such as a binary-phase Dammann grating (or a more efficient arbitrary-phase fanout) is employed to yield multiple equal intensity beams with negligible path length differences attributable to the dividing process. Diffractive elements can also be integrated with passive or active waveguides to yield a highly flexible and compact system for controlling the relative phase between each of the output beams.

A further object of this invention is to provide a means for generating very large. area patterns, greater than that afforded by the natural divergence of an optical beam exiting an optical fiber. A field size enlargement technique is disclosed and is based on the combination of optical fibers with diffusing (or random scattering) optical elements. Diffusers are employed by those skilled in the art of producing holograms of real world objects. Diffusers disrupt the spatial coherence of the illuminating beam, thereby reducing the local interference noise caused by light reflected from various object features. Diffusers also produce a level of spatial optical noise due to their scattering function, an unacceptable result when recording interference patterns. In the prior art, researchers have worked around this problem by mechanically rotating the diffuser to average out spatial noise over recording time, a solution impractical in a production environment, due to the resulting loss in patternable volume creating an imaging-like problem similar to poor depth of focus. An aspect of the present invention is the discovery that when highly divergent light from an optical fiber is directed through a diffuser, the level of spatial noise (or speckle) introduced by the diffuser is vastly reduced, while the function of beam enlargement is maintained, and beam divergence is increased by a factor of two or more with only a slight increase in the level of spatial noise. Specially adapted diffusers can be produced which further enhance the illumination uniformity by varying the radial scattering rate and thereby producing illuminating beams with little variation in intensity. The advantageous combination of a fiber optic waveguide and a diffuser aberrates the resulting illumination, thus averaging out the spatial noise and reducing errors in the resulting holographic pattern.

A final object of this invention is incorporation of an improved illumination setup in a manufacturing tool, yielding more uniform feature size patterning over larger areas. The enhanced feature size uniformity is attained using two techniques. First, the phase of each beam is aberrated to reduce feature distortions and feature spacing variations resulting from the enlarged beams. Second, illumination uniformity is enhanced by overlapping the centroids of the illuminating beams in a plane located a fixed distance from the recording plane. For a given field size, the fixed distance is optimized together with the beam divergence to produce no more than 15% variation in the intensity of integrated illumination. Photoresist modelling shows that variation yields a maximum of five percent variation in recorded feature size.

The aforesaid objects are achieved individually and in combination, and it is not intended that the present invention be construed as requiring two or more of the objects to be combined unless expressly required by the claims attached hereto. The above and still further objects, features and advantages of the present invention will become apparent upon consideration of the following detailed description of a specific embodiment thereof, particularly when taken in conjunction with the accompanying drawings wherein like reference numerals in the various figures are utilized to designate like components.

DESCRIPTION OF THE DRAWINGS

FIG. 1a is a front elevation view in partial cross section of a patterning head of the tool system of the present invention.

FIG. 1b is a side elevation view in partial cross section of the patterning head of FIG. 1a.

FIG. 2 is an perspective view in partial cross section of the tool system remote control tower and water-to-water heat exchanger.

FIG. 3 is an overhead or plan view of the laser source platform and depicts the dividing and coupling of the free space laser beam into the fiber optic cables.

FIG. 4a is an overhead or plan view of the beam delivery breadboard with associated rails for the three beam delivery systems.

FIG. 4b is an overhead or plan view of the beam delivery breadboard with associated rails for the four beam delivery system.

FIG. 6a is an optical schematic diagram of the flexible beam delivery system based on fiber-optic cables; a four beam configuration is shown.

FIG. 6b is an optical schematic diagram of the flexible beam delivery system based on fiber-optic cables; a three beam configuration is shown.

FIG. 7a shows a compact 1:4 fanout structure for dividing a single light source into four sources.

FIG. 7b shows a compact fanout structure using three 1:2 fanouts, for dividing a single light source into four sources.

FIG. 7c depicts a grating-coupled frustrated total internal reflection (FTIR) device for dividing a single light source into multiple sources.

FIG. 7d depicts an integrated optic waveguide structure employing mode cross coupling for dividing a single light source into multiple sources.

FIG. 8a is a computer generated contour plot of intensity distributions for a tool system not employing shifted three-beam illumination; superimposed on the plots is a rectangle representing the screen area of a typical 300 millimeter diagonal display.

FIG. 8b is a computer generated contour plot of intensity distributions for a tool system including the shifted three-beam illumination of the present invention; superimposed on the figure is the rectangle representing the screen display, as in FIG. 8a.

FIG. 9 is similar to FIG. 8b but illustrates the intensity distributions plotted for a four-beam tool system having shorter displacement and a lower beam divergence.

DETAILED DESCRIPTION OF THE PREFERRED EMBODIMENTS

Figure 1:
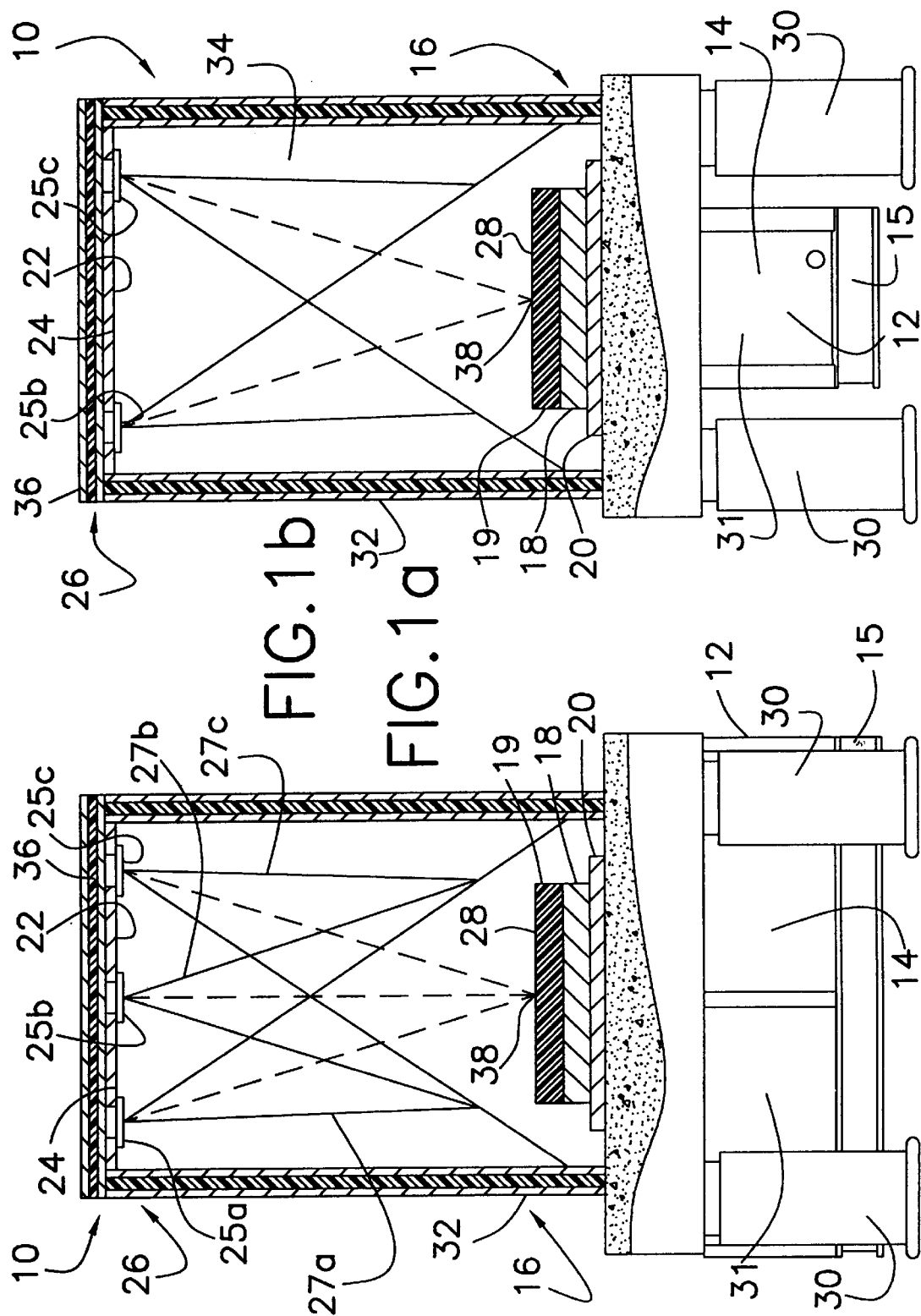

FIGS. 1a and 1b are, respectively, a front elevation view in partial cross section and a side elevation view in partial cross section, illustrating the patterning head 10 of the tool system of the present invention. Patterning head 10 is part of a cluster of tools making up a modern display manufacturing facility. Patterning head 10 includes three main levels: the lowest level 12 contains a laser illumination source 14 on a platform 15 (an embodiment of a laser illumination source is shown in FIG. 3); the middle level 16 is a panel mount or chuck 18 (i.e., for panel or workpiece 19) and X-Y translation stage 20 (detailed in FIG. 5); and a beam delivery breadboard 22 (e.g., as shown in FIG. 4a), mounted in a gantry support system 24 supporting first, second and third carriage mounted fiber positioning stages 25a, 25b and 25c, comprises the top level 26. Deriving power and control signals from the remotely positioned control tower (shown in FIG. 2), patterning head 10 provides the production environment framework within which holographic pattern generation requirements can be met. In particular, there is a requirement for isolating the laser beam paths 27a, 27b, 27c and the recording plane (e.g., the upper surface 28 of workpiece 19) from vibrations due to excessive air flow, mechanical equipment vibrations, acoustic noise and any other ambient source of vibration. Vibration isolation is provided for all three levels 12, 16 and 26 in patterning head 10 using four vertical pneumatic passive damping supports 30. Pneumatic supports or isolators 30 float the patterning head 10 on compressed air. To attenuate vibrations from air currents and airborne acoustic noise, both the laser source walls 31 and the patterning chamber walls 32 are enlcosed using aluminum or stainless steel skinned, foam core panels typical of modern clean room wall coverings. Patterning head 10 is tethered (to the control tower and heat exchanger support equipment shown in FIG. 2) by the laser umbilical and a second cable bundle containing vacuum and electrical control lines.

Patterning head 10 includes a patterning chamber 34 enclosed by four patterning chamber walls 32 and a chamber lid 36. Patterning chamber 34 can be sealed and, when sealed, is optically enclosed or light tight. Mutually coherent laser beams shine downwardly from the fiber positioning stages 25a, 25b, and 25c, along the laser beam paths 27a, 27b, 27c, and are aimed toward panel mount 18 which acts as a platform to support a workpiece to be subjected to the holographic lithography process of the present invention. An aiming point 38 on the panel upper surface 28 is approximately at the center of the laser beam paths 27a, 27b, 27c.

FIG. 2 illustrates support equipment included in the tool system for use with patterning head 10. Patterning head 10 (FIGS. 1a, 1b) is controlled using a control tower 40 including a personal computer 48 that interfaces with the driving electronics, directs the patterning sequence, and monitors the tool system status. The laser source 14 (FIGS. 1a, 1b) is temperature controlled via a stand-alone water-to-water heat exchanger 44. A conventional electric air compressor (not shown) provides the requisite compressed air for the pneumatic table isolation supports 30 (FIGS. 1a, 1b). Control tower 40 also includes an exposure energy meter 46 for measuring and indicating the holographic exposure energy, shutter drivers (and control relays) for controlling timing of the panel exposure and a stepper motor controller 50 for controlling the electric stepper motors used to position the X-Y translation stage 20 (FIGS. 1a, 1b) upon which the panel mount 18 rests within the patterning chamber 34. Control tower 40 is also used to house power supply 52 for laser illumination source 14.

FIG. 3 is an overhead plan view of the platform containing an embodiment of a laser source 14' and represents an optical diagram, drawn approximately to scale, showing the free-space laser beam path, conventional beam splitting and directing optics, fiber-optic coupling connectors, cables and the optomechanical hardware for mounting and aligning the optics and fiber-optic cables. The laser depicted is an argon-ion gas laser 60 generating a polarized, single-frequency (or optionally a single-line) beam with a wavelength of 457.9 nanometers, in the blue range of the visible spectrum. As noted above, the choice of this wavelength contributes to the large field-size, flexible beam delivery, and enhanced illumination uniformity advantages of the tool system of the present invention. Laser source 60 generates a coherent light source beam directed through a sequence of first and second turning mirrors 62, 64, and then to a set of one, two or three beam splitters dividing the single beam into two, three or four equal portions, respectively. As noted above, the patterning tool of the present invention can include two, three or four laser beams. In the embodiment of the laser source 14' shown in FIG. 3, four substantially equal and mutually coherent laser beams are produced by use of first second and third successively positioned beam splitters 66, 68 and 70. As is well known in the art, a beam splitter reflects a portion of an incident laser beam and allows the remainder to pass through; so, as shown in FIG. 3, a portion of the coherent light source beam incident upon beam splitter 66 is reflected at an acute angle toward a first electronic shutter 72 (which is in an open, light transmissive state) and on through first waveplate 74 and is launched into the first flexible fiber optic patch cord 76 via a connectorized mounted fiber positioning stage 78. The light passed through beam splitter 66 is received by beam splitter 68. In similar fashion, the reflected energy from second beam splitter 68 is transmitted through second electronic shutter 80 (when in the open, light transmissive state), through second waveplate 82 and is launched into second flexible fiber optic patchcord 84 via second connectorized mounted fiber positioning stage 86. Likewise, the light passed through beam splitter 68 is received at beam splitter 70. The reflected energy from third beam splitter 70 is transmitted through third electronic shutter 90 (when in the open, light transmissive state), through third waveplate 92 and is launched into third flexible fiber optic patchcord 94 via third connectorized mounted fiber positioning stage 96. Finally, light transmitted through third beam splitter 70 is reflected from a third turning mirror, is transmitted through fourth electronic shutter 100 (when in the open, light transmissive state), through fourth waveplate 102 and is launched into fourth flexible fiber optic patchcord 104 via fourth connectorized mounted fiber positioning stage 106.

The beam splitters 66, 68, and 70 serve to divide the coherent light source beam into first, second third and fourth mutually coherent optical beams. As shown in FIGS. 7a, 7b, 7c and 7d, there are a number of alternatives for dividing the source beam. In alternative embodiments, the source beam is divided upon being directed through a diffractive one-to-four fanout 110 as shown in FIG. 7a, through serially arrayed one-to-two fanouts as shown in FIG. 7b, through a grating coupled frustrated total internal reflection device (FTIR) 111 (comprised of a slab waveguide with spaced diffractive elements) as shown in FIG. 7c, or a mode cross-coupling integrated optic waveguide divider 114 (including a slab waveguide with branching trees and optional electro-optic phase modulators) as shown in FIG. 7d, to generate the four beams desired.

The four beams are then incident upon fiber optic cables 76, 84, 94, 104 (FIG. 3) fitted at the proximal end with pre-aligned, collimator-type fiber coupling connectors included in the respective mounted fiber positioning stages 78, 86, 96, 106. Once launched into and contained by the flexible fiber-optic patch cords the beams are easily manipulated simply by moving the fiber optic patch cords. The fiber optic cables 76, 84, 94, 104 are directed through an access hole in the translation stage table and then up along the gantry support posts to the beam delivery breadboard level, as shown in FIG. 4b.

FIGS. 4a and 4b are overhead views of two embodiments of the laser beam delivery breadboard. The three beam embodiment of FIG. 4a corresponds to the patterning head embodiment 10 of FIGS. 1a and 1b. The four beam embodiment of FIG. 4b corresponds to the laser source embodiment 14' illustrated in FIG. 3. For both embodiments, each fiber optic cable distal end is mounted in a two-axis mechanical gimbal, which in turn is mounted on a carriage type base. The carriages can be manually (or via optional automation) positioned along the length of rails; carriage position defines the range of pattern feature size and pattern feature spacing. Graduated stops along the calibrated rail system are located at commonly selected positions. Gantry support system 24 is illustrated in FIG. 4a and includes a planar support beam delivery breadboard 22 affixed to four vertical granite columns or stanchions 134. A three beam rail system 118 is bolted to gantry support system 24 and includes first, second and third equal length rails 120, 122 and 124, radially spaced in a common plane and affixed to one another in a center rail connection hub 128 disposed near the center of the patterning chamber 34. Rail graduation markings 126 are used to position the carriage mounted fiber positioning stages 25a, 25b, 25c, which are preferably positioned at equal distances from the center rail connecting hub 128, as can be seen by use of the imaginary reference lines 130 included in FIG. 4a. Patterning chamber walls 32 can be seen in cross section, as well as the four corner granite stanchion supports 134. The four rail embodiment of the rail system is shown in FIG. 4b and includes first, second, third and fourth rails 136, 138, 140 and 142, respectively, arrayed in a common plane and radially spaced and affixed to one another at the center of the chamber 34' in a center rail connection hub 144; this embodiment also includes patterning chamber walls 32 and the four corner granite stanchion supports 134, as above. For the embodiments of FIG. 4a or FIG. 4b, the entire breadboard (e.g., 22 of FIGS. 1a and 4a) is supported at the four corners by precision machined vertical granite stanchions 134. Laser beams emanating from the fiber-optic cable distal ends are directed downwardly towards the translation stage/panel mount level, as discussed above.

Figure 5:
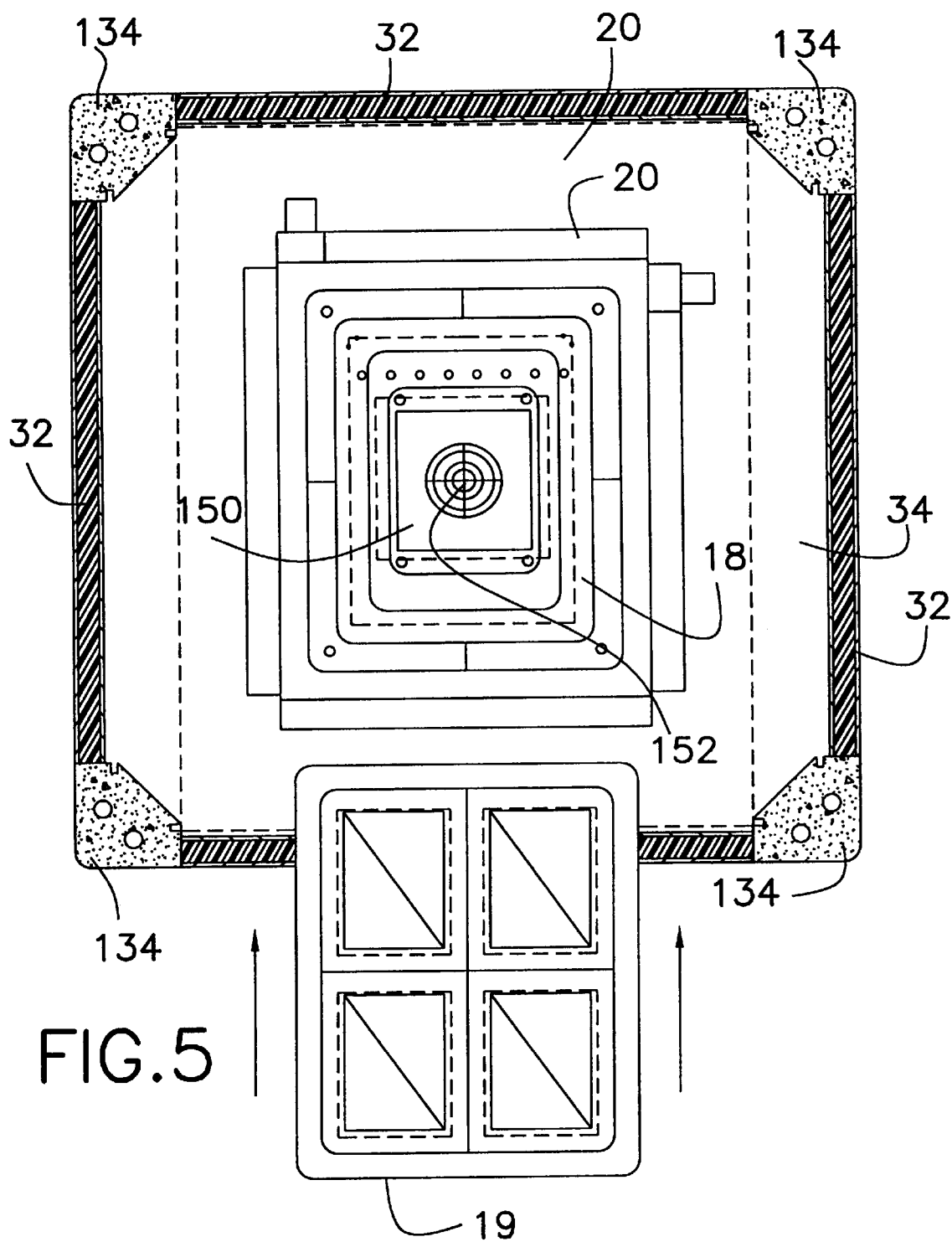
FIG. 5 is an overhead or plan view of the recording plane translation stage and substrate mounting system, or chuck; also depicted is a maximum-size substrate with a typical pattern area.

FIG. 5 is an overhead view of the translation stage level 16 depicting the range of travel or translation for the two-axis X-Y stage 20 and the panel mount 18 including a vacuum chuck 150. In the embodiment illustrated, vacuum suction force for the chuck 150 is controlled in zones by computer; a variety of vacuum control schemes permits accommodation of a variety of panel sizes, up to a maximum of 650 by 550 millimeters. Larger panels can be accepted with simple changes in the scale of the tool and chuck 150. Chuck temperature can be maintained under computer control. The chuck 150 incorporates a panel lift feature to facilitate the automated panel loading and unloading, and a beam power detector 152 is at the aiming point 38 (e.g., as in FIG. 1a) and integrated below the chuck surface for automated exposure metering.

The illumination system of the present invention is schematically illustrated in FIG. 6a which shows a flexible, shifted four-beam illumination architecture. FIG. 6b schematically illustrates a three-beam embodiment. As discussed above, the beam from laser source 14 is divided, in any of the manners described herein, and launched into fiber-optic cables at the cable proximal ends (e.g., at the mounted fiber positioning stages 78, 86, 96 and 106). Coupling of laser light into single-mode, polarization maintaining fiber (optical waveguide) has traditionally been a difficult task due to the small fiber core diameters—typically in the two to four micron range. Recently, however, fiber-optic cable manufacturers have been "connectorizing" cable products with mechanical mounting hardware and optics, usually for collimating the light emanating from the fiber ends. However, in the present invention, a typical fiber collimator is operated in a reverse sense, whereby nearly collimated laser light is coupled into the fibers at the fiber proximal ends (e.g., at the mounted fiber positioning stages 78, 86, 96 and 106), whereupon the alignment tolerances for launching light into the fiber are greatly increased and coupling stability is vastly improved. These advantages, together with the flexible nature of the fiber cables, make fiber cables well suited for use in the manufacturing tool of the present invention. Another surprising advantage obtained by employing fiber-optic cables is the ability of fiber optic cables to replace the function of conventional spatial filters used in laboratory setups. The act of coupling the laser light into the fiber cable eliminates amplitude noise in the beams, and produces highly divergent beams as a result of the confinement of the light within the small diameter fiber core. The highly divergent beams emanating from the ends of fiber cables, as shown in FIGS. 6a and 6b, have a high numerical aperture. The fibers are cut to lengths which allow the optical path lengths to be set equal, thereby allowing the laser to operate at an increased power level afforded by the presence of multiple longitudinal modes, or, using industry terminology, single-line operation. Connectorized on the distal end of each fiber, an optical element 160 (i.e., a conventional refractive lens) can be employed to optimize the divergence of the illuminating beams illuminating the workpiece. However, in the preferred embodiment, optical element 160 is a conventional diffusing element imparting both phase and amplitude noise or aberration which, in conjunction with the highly divergent beam emanating from the fiber distal end, tailors the phase noise. As discussed above, this combination yields precise control over the illuminating beam divergence without the unacceptable spatial noise as is typically found when using diffusers. The advantageous combination of a fiber optic waveguide and a phase aberrating diffuser modifies the resulting illumination beam, thus averaging out the spatial noise and reducing errors in the resulting holographic pattern. Optical element 160 is preferably a diffuser having a diffusing angle in the range of 5°–40° (uniform or gaussian) and is preferably selected to optimize microscopic feature uniformity; at present a diffuser having a diffusing angle of 10° is being experimented with. Alternatively, optical element 160 can be a mirror including diffusing and enlarging surfaces, employed in a reflective-mode operation. In the three-beam embodiment of FIG. 6b, the cable distal ends 164 are located in a common plane 166 and in a triangle arrangement; the recording plane 168 is located at a fixed distance (e.g., greater than one meter) from and parallel to the common plane 166 defined by and containing the cable distal ends 164. Alternatively, with four beams as shown in FIG. 6a, the cable distal ends 164 define and are positioned in a planar square grid 170. The arrangements of FIGS. 6a and 6b produce a two-dimensional interference pattern which can be observed at the recording plane 168.

In the laboratory work of the prior art, the recording plane 168 coincides with the plane containing the intersecting beam centroids (i.e., the plane defined by the point of intersection of the centers of the three or four illuminating beams). FIGS. 6a and 6b also show the shifted illumination technique of the present invention by which the beam centroids are displaced from (i.e., do not intersect in) the recording plane 168, but instead intersect in a shifted or offset plane 172 located five to ten centimeters above and parallel to the recording plane 168. Because the intensity of the light emerging from the fiber-optic cable distal ends 164 is greatest at the beam center and decreases along a beam radius with a nearly gaussian distribution, angularly displacing the three (or four) illuminating beams allows for a more uniform illumination at a recording plane 168 vertically offset (e.g., by five to ten centimeters) from the beam centroid overlap plane 172.

FIGS. 8a and 8b illustrate this effect for the three illumination beam embodiment of FIG. 6b. The plots of FIG. 8a and FIG. 8b represent the macroscopoic intensity distribution resulting from overlapping three illuminating beams. On this macroscopoic scale, the intensities of the three beams are summed and the resulting distribution is represented in a contour plot where each successively outer ring represents a drop of five per cent from the next interior or higher intensity. Also plotted in the figures is a rectangle 180 representing a two hundred fifty by two hundred millimeter area corresponding to a three hundred millimeter diagonal screen area suitable for FED patterning. In the plots of FIGS. 8a and 8b, the divergence of the illuminating beams is fixed. FIG. 8a depicts the illumination found in the shifted or offset plane 172 (FIG. 6b) where all three beam centroids overlap. In this case the resulting intensity distribution varies with the expected gaussian profile yielding a 50% variation in the level of the illumination within the rectangular target field 180. This directly impacts the feature size recorded in photoresist, yielding a comparable and unacceptable feature size variation over the exposed area. One solution to this problem would be to further expand the size of the illuminating beams, however this becomes impractical at existing laser power levels and would lead to long exposure times and poor tool manufacturing throughput. In the method of the present invention, the illuminating beam centroids are axially displaced, thereby shifting the beam centroid overlap plane away from the recording plane and effectively broadening the area of low variation illumination, the results of which are depicted in FIG. 8b, again for a fixed beam divergence. The plot of FIG. 8b represents the illumination in a recording plane 168 axially offset or shifted some distance from the plane 172 in which the beam centroids overlap; an apparent displacement of each of the three illuminating beams is observed. Note that a more acceptable maximum variation of only 15% in illumination level is found in the corners 182 of the rectangular target field 180. The optimum shift in this illumination model was eighteen centimeters measured along lines radiating out from the center to the corners of an isosceles triangle, and the gaussian beam diameters in the plane are nearly sixty centimeters, providing ample beam overlap as is necessary for generating the microscopic interferometric patterns.

FIG. 9 depicts the plotted experimental results (also as illumination intensity contours over an area) for the shifted illumination technique of the present invention utilizing four illuminating beams, as in FIG. 6a. Comparing the plots of FIG. 8b to FIG. 9, it is evident in FIG. 9 that good illumination uniformity over the rectangular target 184 is more readily obtained with four beams, yielding lower beam divergence and smaller displacements. The illumination intensity contour curves plotted in FIG. 9 are for a four-beam system incorporating an offset or shift of only ten centimeters with illuminating beam diameters one-third smaller than those for which results are depicted in FIG. 8b. The lower beam divergence yields a more concentrated illumination and consequently shorter exposure times and higher tool manufacturing throughput.

From the foregoing description it will be appreciated that the invention makes available a tool and method for holographic lithography well suited for use in manufacturing environments, the embodiments disclosed herein are examples and many variations are possible. For example, arrays of lines suitable for grating or electrode applications may be obtained by utilizing two or three illuminating beams. Such patterns may also be useful in forming alignment layers for liquid crystal-based devices and displays. Asymmetric placement of the illuminating beams (e.g., by asymetric placement of the carriage mounted fiber positioning stages 25a, 25b, 25c on rails 136, 138 and 140) can generate a variety of sub-micron sized structures having rectangular or oval shapes and suitable for phase shifting optics or for patterning more arbitrarily shaped structures for integrated circuit applications. Because the microscopic interference patterns exist wherever the illuminating beams overlap, the patterning system can also be used to generate periodic structures on arbitrarily shaped surfaces such as missile domes, aircraft canopies, and curved refractive optics.

As noted above, a variety of products could benefit from the increased ruggedness and anti-reflective performance afforded by motheye surfacing over large areas. A partial list includes applications such as automobile or aircraft windows, protective or anti-glare screens for artwork or displays, eye or sun glasses, residential or commercial windows, imaging systems such as cameras, telescopes, microscopes, and binoculars, as well as photocells for use in optical sensing, optical data transmission and energy gathering. In addition, motheye surfaces find application in the diamond film industry where increased surface area may enhance the adhesion of the diamond layers, and the surface structures themselves may provide a greater density of diamond nucleation sites yielding a more uniform film coating.

Having described preferred embodiments of a new and improved method and apparatus, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A lithographic tool system including an interferometric pattern generator, comprising:

a coherent light source generating a coherent light source beam;

means for dividing said coherent light source beam into first, second and third mutually coherent optical beams;

a first optical waveguide having a first end and a second end including means for launching said first mutually coherent optical beam into said first waveguide first end and having an optical element on said first waveguide second end, wherein said optical element causes said first mutually coherent optical beam to become a first divergent beam having a first centroid;

a second optical waveguide having a first end and a second end including means for launching said second mutually coherent optical beam into said second waveguide first end and having an optical element on said second waveguide second end, wherein said optical element causes said second mutually coherent optical beam to become a second divergent beam having a second centroid;

a third optical waveguide having a first end and a second end including means for launching said third mutually coherent optical beam into said third waveguide first end and having an optical element on said third waveguide second end, wherein said optical element causes said third mutually coherent optical beam to become a third divergent beam having a third centroid;

a platform having a substantially planar surface adapted to support a workpiece having a selected thickness and a photosensitive surface;

a first support disposed a selected distance from the platform surface, wherein said first support includes a first mount, and said first waveguide second end is affixed to said first mount and positioned to aim said first divergent beam at said platform surface;

wherein said first support further includes a second mount, and said second waveguide second end is affixed to said second mount and positioned to aim said second divergent beam at said platform surface;

wherein said first support further includes a third mount, and said third waveguide second end is affixed to said third mount and positioned to aim said third divergent beam at said platform surface; and wherein said first divergent beam, said second divergent beam, and said third divergent beam are combined to generate an interferometric pattern of light in a reference plane, said reference plane being defined by overlap of said centroids of said first, second and third divergent beams, and said reference plane is substantially parallel to said platform surface.

2. The lithographic tool system of claim 1, wherein said first, second and third optical waveguides are of substantially equal length.

3. The lithographic tool system of claim 1, wherein said reference plane is offset from said platform surface by an offset distance greater than said workpiece selected thickness.

4. The lithographic tool system of claim 3, wherein said offset distance is in the range of five to ten centimeters.

5. The lithographic tool system of claim 1, wherein said means for launching said first mutually coherent optical beam into said first waveguide first end comprises a collimator.

6. The lithographic tool system of claim 1, wherein said first waveguide comprises a single-mode polarization maintaining optical fiber.

7. The lithographic tool system of claim 1, wherein said optical element on said first waveguide second end comprises a refractive lens.

8. The lithographic tool system of claim 1, wherein said optical element on said first waveguide second end comprises a diffusing optical element.

9. The lithographic tool system of claim 1, wherein said coherent light source comprises an argon-ion gas laser.

10. The lithographic tool system of claim 1, wherein said a coherent light source beam is polarized and has a wavelength in the blue range of the visible spectrum.

11. A method for generating an interferometric pattern, comprising the following method steps:

(a) generating a coherent light source beam;

(b) dividing said coherent light source beam into first, second and third mutually coherent optical beams;

(c) launching said first mutually coherent optical beam into a first waveguide first end, wherein said launching causes said first mutually coherent optical beam to become a first aberrated beam having a first centroid;

(d) launching said second mutually coherent optical beam into a second waveguide first end, wherein said launching causes said second mutually coherent optical beam to become a second aberrated beam having a second centroid;

(e) providing a first support at a selected distance from a substantially planar platform surface, (f) placing a workpiece having a selected thickness and a photosensitive surface on said panel surface;

(g) aiming said first aberrated beam at said platform surface;

(h) aiming said second aberrated beam at said platform surface;

(i) combining said first aberrated beam and said second aberrated beam; and (j) generating an interferometric pattern of light in a reference plane, said reference plane being defined by overlap of said centroids of said first and second aberrated beams, wherein said reference plane is substantially parallel to said platform surface and offset from said platform surface by a selected offset distance greater than said workpiece selected thickness.

12. The method of claim 11, wherein step (b) includes directing said coherent light source beam toward a diffractive fanout element.

13. The method of claim 11, wherein step (b) includes directing said coherent light source beam toward a grating coupled reflective optical element.

14. The method of claim 11, wherein step (b) includes directing said coherent light source beam toward a mode cross coupling integrated optic waveguide.

15. The method of claim 11, wherein step (b) includes directing said coherent light source beam toward a beam splitter.

16. The method of claim 11, wherein step (c) comprises launching said first mutually coherent optical beam through a diffuser at said first waveguide second end.

17. A lithographic tool system including an interferometric pattern generator, comprising:

a coherent light source generating a coherent light source beam;

means for dividing said coherent light source beam into first, second, third and fourth mutually coherent optical beams;

a first optical waveguide having a first end and a second end including means for launching said first mutually coherent optical beam into said first waveguide first end and having a diffusing optical element on said first waveguide second end, wherein said optical element causes said first mutually coherent optical beam to become a first divergent aberrated beam having a first centroid;

a second optical waveguide having a first end and a second end including means for launching said second mutually coherent optical beam into said second waveguide first end and having a diffusing optical element on said second waveguide second end, wherein said optical element causes said second mutually coherent optical beam to become a second divergent aberrated beam having a second centroid;

a third optical waveguide having a first end and a second end including means for launching said third mutually coherent optical beam into said third waveguide first end and having a diffusing optical element on said third waveguide second end, wherein said optical element causes said third mutually coherent optical beam to become a third divergent aberrated beam having a third centroid;

a fourth optical waveguide having a first end and a second end including means for launching said fourth mutually coherent optical beam into said fourth waveguide first end and having a diffusing optical element on said fourth waveguide second end, wherein said optical element causes said first mutually coherent optical beam to become a fourth divergent aberrated beam having a first centroid;

a platform having a substantially planar surface adapted to support a workpiece having a selected thickness and a photosensitive surface;

a first support disposed a selected distance from the platform surface, wherein said first support includes a first mount, and said first waveguide second end is affixed to said first mount and positioned to aim said first divergent aberrated beam at said platform surface;

wherein said first support further includes a second mount, and said second waveguide second end is affixed to said second mount and positioned to aim said second divergent aberrated beam at said platform surface;

wherein said first support further includes a third mount, and said third waveguide second end is affixed to said third mount and positioned to aim said third divergent aberrated beam at said platform surface;

wherein said first support further includes a fourth mount, and said fourth waveguide second end is affixed to said fourth mount and positioned to aim said fourth divergent aberrated beam at said platform surface; and wherein said first divergent aberrated beam, said second divergent aberrated beam, said third divergent aberrated beam and said fourth divergent aberrated beam are combined to generate an interferometric pattern of light in a reference plane, said reference plane being defined by overlap of said centroids of said first, second, third and fourth divergent aberrated beams, and said reference plane is substantially parallel to said platform surface.

18. The lithographic tool system of claim 17, wherein said first, second, third and fourth optical waveguides are of substantially equal length.

19. The lithographic tool system of claim 17, wherein said reference plane is offset from said platform surface by an offset distance greater than said workpiece selected thickness.

20. The lithographic tool system of claim 19, wherein said offset distance is in the range of five to ten centimeters.

21. The lithographic tool system of claim 17, wherein said means for launching said first mutually coherent optical beam into said first waveguide first end comprises a collimator.

22. The lithographic tool system of claim 17, wherein said first waveguide comprises a single-mode polarization maintaining optical fiber.

* * * * *